(12) United States Patent
Varadarajan et al.

(10) Patent No.: US 8,831,077 B2
(45) Date of Patent: Sep. 9, 2014

(54) COMMUNICATION ON A PILOT WIRE (75) Inventors: Badri Varadarajan, Mountain View, CA (US); Il Han Kim, Dallas, TX (US); Anand Dabak, Plano, TX (US); Edward Mullins, Sahuarita, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 628 days.

(21) Appl. No.: 13/163,513

(22) Filed: Jun. 17, 2011

(65) Prior Publication Data

US 2012/0002714 A1 Jan. 5, 2012

Related U.S. Application Data (60) Provisional application No. 61/360,673, filed on Jul. 1, 2010.

(51) Int. Cl.
*H04B 1/38* (2006.01)
*H04B 3/54* (2006.01)
*H04L 25/49* (2006.01)
*H03K 7/08* (2006.01)

(52) U.S. Cl.
CPC .......... *H03K 7/08* (2013.01); *H04B 2203/5416* (2013.01); *H04B 3/54* (2013.01); *H04L 25/4902* (2013.01)
USPC ........... 375/222; 375/219; 375/223; 375/238; 375/259; 375/377

(58) Field of Classification Search
CPC ... Y02T 10/7088; Y02T 90/128; Y02T 90/14; Y02T 10/7077; Y02T 90/163; Y02T 90/169; Y02T 90/168; B60L 11/1825; B60L 2230/16; B60L 11/1844; B60L 11/1824; B60L 11/1846; B60L 3/00; H04L 25/4902; H04B 3/54; H04B 2203/5416; H04B 1/38; H03K 7/08; H02J 7/00

See application file for complete search history.

(56) References Cited

U.S. PATENT DOCUMENTS

| | | | | |
|---|---|---|---|---|
| 5,602,459 | A * | 2/1997 | Rogers | 320/138 |
| 7,028,819 | B2 * | 4/2006 | Saito et al. | 191/2 |
| 8,405,939 | B2 * | 3/2013 | Haines et al. | 361/42 |
| 8,432,175 | B2 * | 4/2013 | Hein | 324/705 |
| 8,447,543 | B2 * | 5/2013 | Dickinson et al. | 702/60 |
| 2009/0278547 | A1 * | 11/2009 | Acena et al. | 324/509 |

(Continued)

FOREIGN PATENT DOCUMENTS

| JP | 2008236902 A | 10/2008 |
|---|---|---|
| JP | 2008278559 A | 11/2008 |
| JP | 2009189143 A | 8/2009 |

*Primary Examiner* — Hirdepal Singh
(74) *Attorney, Agent, or Firm* — Steven A. Shaw; Frederick J. Telecky, Jr.

(57) ABSTRACT

Systems and methods are disclosed for communicating on a pilot wire between Electric Vehicle Service Equipment (EVSE) and an Electric Vehicle (EV). The EVSE and EV exchange a Pulse Width Modulation (PWM) signal on the pilot wire to control charging operations of the EV. Data communications may also be transmitted on the pilot wire, such as between transmit and receive modems. The modems transmit communication signals either continuously, without regard to the state of the PWM signal, or only when the PWM is in an off-state. If transmitting while PWM is on, the modem needs a large coupling impedance and/or a large signal injection. To transmit only when the PWM is off, the modem may use a blocking diode in the coupling circuit or may synchronize to the pulses in the PWM signal.

17 Claims, 5 Drawing Sheets

(56) References Cited

U.S. PATENT DOCUMENTS

| | | | |
|---|---|---|---|
| 2009/0301801 A1* | 12/2009 | Fujitake | 180/65.29 |
| 2009/0323239 A1* | 12/2009 | Markyvech | 361/57 |
| 2010/0097029 A1* | 4/2010 | McCabe | 320/103 |
| 2010/0316140 A1* | 12/2010 | Razazian et al. | 375/257 |
| 2012/0022811 A1* | 1/2012 | Dickinson et al. | 702/60 |
| 2012/0032636 A1* | 2/2012 | Bianco | 320/109 |
| 2012/0116745 A1* | 5/2012 | Dickinson et al. | 703/18 |
| 2013/0015815 A1* | 1/2013 | Bianco | 320/109 |
| 2013/0094552 A1* | 4/2013 | Vedantham et al. | 375/222 |
| 2013/0190968 A1* | 7/2013 | Nitzberg et al. | 701/31.6 |
| 2013/0307551 A1* | 11/2013 | Makino | 324/434 |
| 2013/0320920 A1* | 12/2013 | Jefferies et al. | 320/109 |

\* cited by examiner

COMMUNICATION ON A PILOT WIRE

CROSS-REFERENCE TO RELATED APPLICATIONS

The present application claims the benefit of the filing date of U.S. Provisional Patent Application No. 61/360,673, which is titled "Method of Communication on a Pilot Wire" and was filed Jul. 1, 2010, the disclosure of which is hereby incorporated by reference herein in its entirety.

TECHNICAL FIELD

Embodiments of the invention are directed, in general, to electric vehicles and, more specifically, communications carried on a pilot wire coupled to an electric vehicle.

BACKGROUND

Electric vehicles—i.e. vehicles propelled by one or more electric motors—are powered by large, rechargeable batteries. Electric vehicles are limited by available battery technology, which limits the range per charge for most electric vehicles. For widespread deployment and use of electric vehicles to be feasible, there must be widely available recharging stations, such as in homes and public locations.

Electric Vehicle Supply Equipment (EVSE) includes chargers and charging stations for electric vehicles. The EVSEs regulate the amount of power that the electric vehicle draws from the charging station. The electric vehicle is connected to a cable from the EVSE using a special connector, such as an SAE J1772-compliant connector. The connector may include a number of pins corresponding to different connections between the electric vehicle and the EVSE, such as a 120 V AC line, a 240 V AC line, a ground line, a pilot wire, and other connections. When the electric vehicle is connected to the EVSE, the pilot wire is used to regulate the electricity available to, and/or drawn by, the electric vehicle. A Pulse Width Modulation (PWM) control signal is carried on the pilot wire between the EVSE and the electric vehicle. The duty cycle of the PWM signal indicates to the electric vehicle whether it should recharge by drawing power from the 120 V AC line, or the 240 V AC line, for example.

The EVSE is coupled to a power line network, such as an electrical distribution network for a home, and regulates the electricity drawn by the electric vehicle from the power line network. Power line communications are used on some power line networks to transmit data and communication signals. Because the electric vehicle is coupled to the power line network via the EVSE cable, power line communications may be routed between the electric vehicle and modems on the power line network.

SUMMARY OF THE INVENTION

A pilot wire system couples Electric Vehicle Service Equipment (EVSE) and an Electric Vehicle (EV) and has a pilot wire carrying pulse width modulation (PWM) signals between the EVSE and EV. First and second modems are also coupled to the pilot wire and exchange communication signals via the pilot wire. An interface circuit couples the first modem to the pilot wire. In one embodiment, the interface circuit is configured to have an impedance that is larger than an effective impedance of the pilot wire system.

In another embodiment, a line driver circuit in the interface circuit amplifies the communication signals prior to injection onto the pilot wire. The line driver circuit amplifies the communication signals by an amount proportional to a variation in the effective impedance of the pilot wire system, wherein the effective impedance variations are caused by the PWM signals changing from an on-state to an off-state. The effective impedance of the pilot wire system may correspond to a combination of an electric vehicle service equipment impedance, an electric vehicle impedance, and a pilot wire cable impedance.

The communication signals may be Orthogonal Frequency-Division Multiplexing (OFDM) signals that comply with a PRIME (Powerline Related Intelligent Metering Evolution) or G3 standard. The communication signal may be Frequency Shift Keying (FSK) or Phase Shift Keying (PSK) signals depending on the transmission method.

In another embodiment, a first modem is coupled to a pilot wire system. The pilot wire system couples the EVSE and EV using a pilot wire carrying PWM signals. The first modem transmitting communication signals to a second modem via the pilot wire. An interface circuit couples the first modem to the pilot wire. The interface circuit includes a diode that blocks the first modem communication signals from reaching the pilot wire when a PWM pulse is present on the pilot wire. The diode comprises an anode coupled to the first modem and a cathode coupled to the pilot wire. The diode conducts the first modem communication signals to the pilot wire when the PWM signals are off.

In a further embodiment, a first modem monitors the PWM signals on the pilot wire to identify whether the PWM signals are on or off. The first modem transmits communication signals to a second modem via the pilot wire when the PWM signals are off. The first modem stops transmitting the communication signals when the PWM signals are on. The communication signals may be OFDM signals having a zero prefix that coincides with a duty cycle of the PWM signals.

BRIEF DESCRIPTION OF THE DRAWINGS

Having thus described the invention in general terms, reference will now be made to the accompanying drawings, wherein:

DETAILED DESCRIPTION

The invention now will be described more fully hereinafter with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. One skilled in the art may be able to use the various embodiments of the invention.

Figure 1:
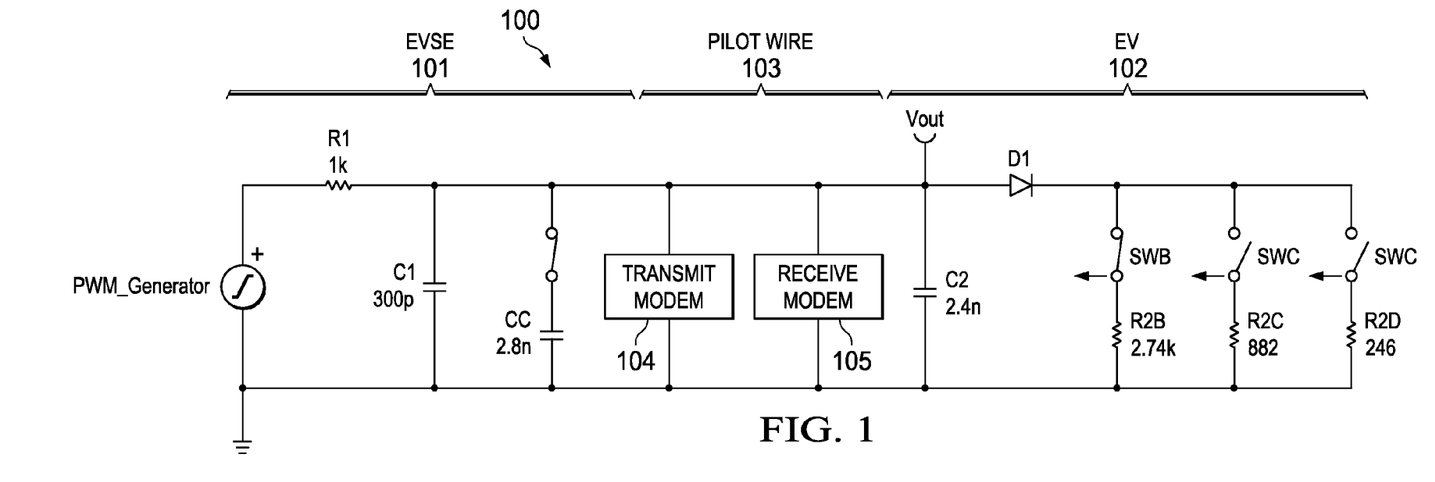
FIG. 1 illustrates a pilot-wire communication model having an electric vehicle supply equipment section, an electric vehicle section, and a pilot wire section.

FIG. 1 illustrates a pilot-wire communication model 100 having Electric Vehicle Supply Equipment (EVSE) section 101, Electric Vehicle (EV) section 102, and pilot wire section 103 connecting EVSE 101 to EV 102. Information is communicated between EVSE 101 and EV 102 using a Pulse Width Modulation (PWM) signal on pilot wire 103. The information conveyed to the EV 102 from the EVSE 101 is contained in the PWM signal's duty cycle and signal level.

Additionally, transmit modem 104 communicates with a receive modem 105 via pilot wire 103. To preserve the duty cycle information, transmit modem 104 and receive modem 105 must have sufficiently large impedance to prevent the PWM signal pulses from spreading and, therefore, changing the duty cycle. The signal from the transmit modem will be added to the PWM pulses and, therefore, may affect the apparent PWM signal level observed at EV 102. Accordingly, the transmit modem must inject a relatively small signal during the PWM pulses to preserve the PWM level transmitted by EVSE 101.

Figure 2:
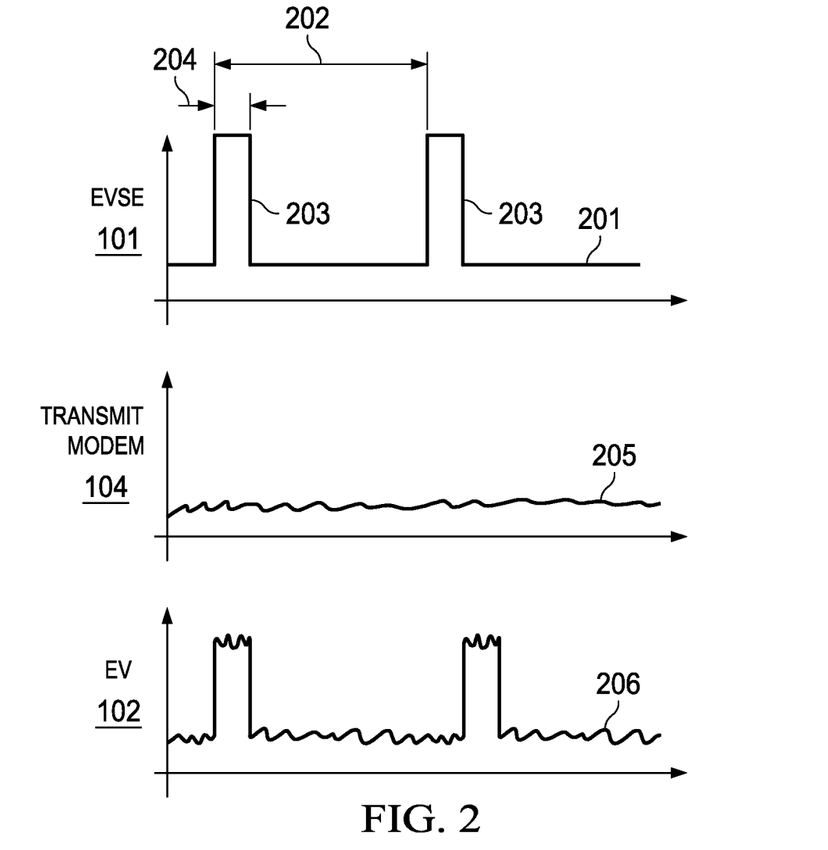
FIG. 2 illustrates signals transmitted by the electric vehicle supply equipment and by the transmit modem.

FIG. 2 illustrates signals transmitted by EVSE 101 and by transmit modem 104. PWM signal 201 is generated by EVSE 101 and is sent over pilot wire 103 to the EV 102. The PWM signal 201 has a repeating period 202 comprising a plurality of pulses 203 having pulse widths 204. The signal levels for pulses 203 as well as the duty cycle of PWM signal 201 carry information to EV 102. The PWM signal 201 is generated in accordance with a standard used by both EVSE 101 and EV 102. The pulse width 204, signal level of pulse 203, and duty cycle of PWM signal 201 must comply with the standard. The signals added to the pilot wire 103 by transmit modem 104 should not affect the characteristics of the PWM signals or the PWM signal may not comply with the relevant standard.

Signal 205 is a data signal generated by transmit modem 104. In one embodiment, signal 205 is an Orthogonal Frequency-Division Multiplexing (OFDM) signal corresponding to the PRIME (Powerline Related Intelligent Metering Evolution) or G3 standards. In other embodiment, transmit modem 104 and receive modem 105 may communicate using a different standard or protocol, such as a Spread Frequency Shift Keying (S-FSK) corresponding to the International Electrotechnical Commission (IEC) 61334-5-1 standard or Phase Shift Keying (PSK).

For successful communication between modems 104, 105, the transmit modem 104 should inject signal 205 with a sufficiently large signal level to overcome interference from the PWM signal 201 and noise on the pilot wire 103. In one embodiment, the pilot wire noise is approximately 500 mV p-p noise over a 10 MHz channel, and the maximum transmit modem signal 205 is approximately 600 mV p-p.

Transmit modem 104 may transmit signal 205 either continuously or during selected periods. In one embodiment, transmit modem 104 transmits signal 205 without regard to the state of PWM signal 201. In another embodiment, transmit modem 104 transmits signal 205 only during the off state for PWM signal 201. Signal 206 illustrates a combined signal level 206 that would be detected by EV 101 on pilot wire 103. Signal 206 would occur if transmit modem 104 transmitted all the time, including when PWM signal 201 is on.

Certain constraints may be required if transmit modem 104 is on during PWM pulses 203. In particular, the coupling circuits for transmit modem 104 and receive modem 105 may need to be adapted to minimize or avoid the modems' effect on the pilot wire characteristics.

Figure 3:
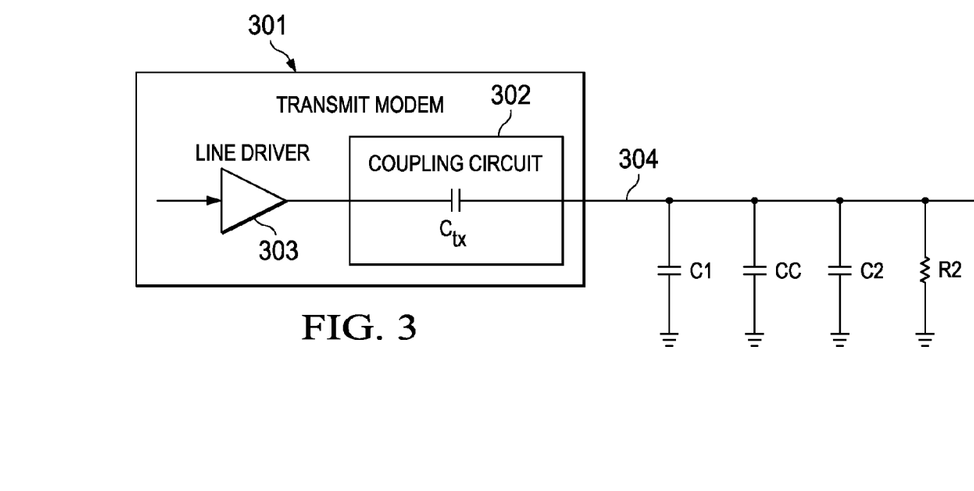
FIG. 3 illustrates a transmit modem that includes a coupling circuit.

FIG. 3 illustrates a transmit modem 301 that includes a coupling circuit 302. Signals generated in transmit modem 301 are fed through line driver 303 and coupling circuit 302 to pilot wire 304. The effective impedance of PWM circuit 100 (FIG. 1) to ground is $Z_{eff}=(C1\|C_c\|C2\|R2)$. $Z_{eff}$ may vary significantly depending on the equivalent capacitance $(C1+C_c)$ of EVSE 101. In some embodiments, the EVSE capacitance (C1+Cc) value may vary from 300 pF to 3100 pF. While transmitting, transmit modem 301 has an impedance $Z_{tx}$ that is determined by the capacitance $C_{tx}$ of coupling circuit 302. Certain constraints to transmit modem 104 may be considered to improve system performance during constant modem signal transmission.

To ensure that the behavior of PWM circuit 100 does not change during constant operation of transmit modem 104, the coupling circuit impedance $Z_{tx}$ must be much larger than the impedance $Z_{eff}$. In the example illustrated in FIG. 3, if $C_{tx}$ is larger than approximately 1 nF, then PWM pulse 203 rise time is increased, which increases the pulse width 204 of PWM pulse 203 and reduces the duty cycle of the PWM signal. This result is unacceptable because it can change the information carried on the PWM signal, which is represented at least in part by the duty cycle. A first constraint is to require coupling circuit 302 to have an impedance $Z_{tx}$ that is larger than the largest value of PWM impedance $Z_{eff}$.

Taking into account the modem and PWM system impedances, the received signal level $(S_{rx})$ is equal to the transmitted signal level $(S_{tx})$ times $Z_{eff}/(Z_{eff}+Z_{tx})\approx S_{tx}\times(Z_{eff}/Z_{tx})$. The received $S_{rx}$ signal varies almost linearly with $Z_{eff}$, which could, in theory, vary by a factor of 10. Assuming that the minimum signal level required for communication is defined as $V_{min}$, then a second constraint is that the input signal $S_{tx}$ may need to be up to $10\times V_{min}$ to compensate for worst case signal variation.

Figure 4:
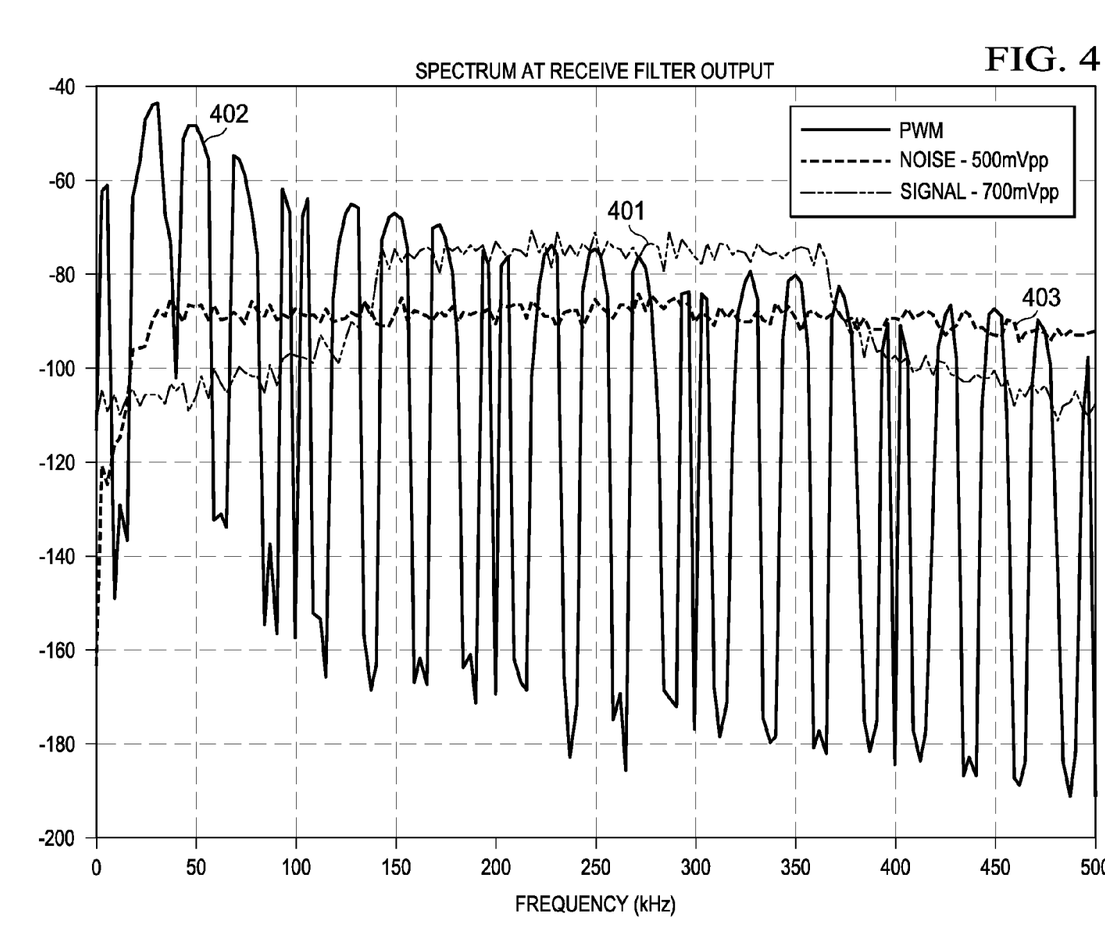
FIG. 4 illustrates frequency-domain signals received at receive modem.

FIG. 4 illustrates the frequency-domain signals $S_{rx}$ received at receive modem 105 (FIG. 1). The total received signal $S_{rx}$ is equal to signal $S_{tx}$ 401 transmitted by transmit modem 104, plus the PWM signal 402 transmitted by EVSE 101, plus noise 403. As illustrated in FIG. 4, pulses in PWM signal 402 generate significant in-band frequency components. Transmitted signal $S_{tx}$ 401 is 700 mV p-p, and noise signal 403 is 500 mV p-p over 10 MHz. Additionally, the in-band components of PWM 402 cause large in-band impulsive noise during every transition of PWM pulses 203. In one embodiment, the in-band signal-to-AWGN noise ratio is approximately 13 dB. As illustrated in FIG. 4, the PWM signal 402 overrides some of the transmit modem signal 401, which will result in erasing some of the transmit modem signal.

Figure 5:
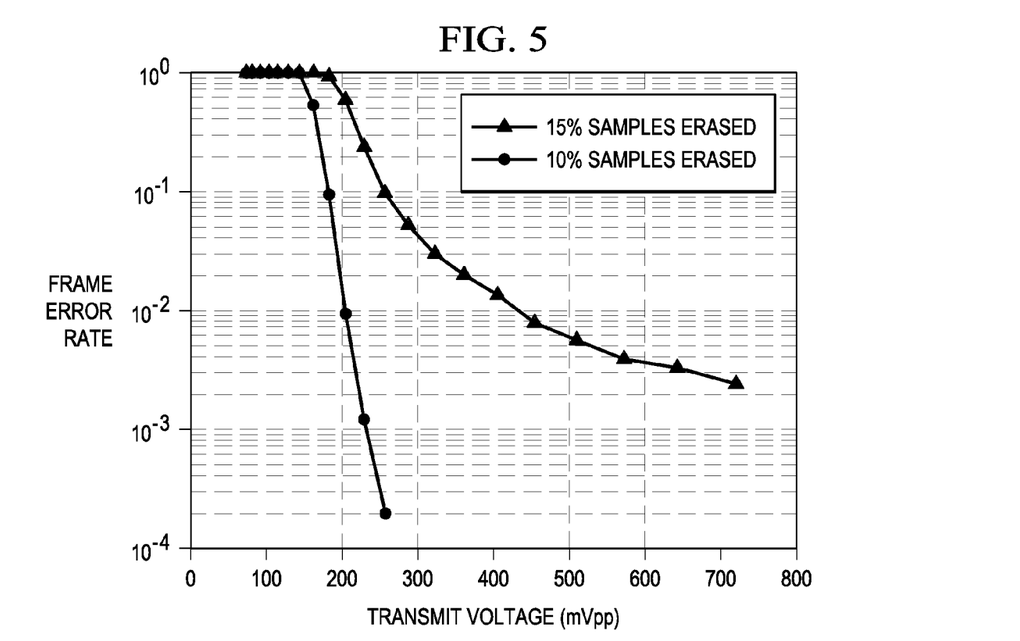
FIG. 5 illustrates simulation results for an OFDM signal transmitted by a transmit modem on a PWM system.

FIG. 5 illustrates simulation results for an OFDM signal transmitted by a transmit modem on a PWM system. As illustrated, the frame error rate decreases with increasing transmit voltage. Additionally, the frame error rate is better for configuration 501 (10% of samples erased by PWM) compared to configuration 502 (15% of samples erased by PWM). The main source of error is the PWM components in-band with the transmit modem signal. These errors may be combated in one embodiment by detecting when the PWM spikes will occur and erasing them. In one embodiment, 15% erasures are expected, so a 400 mV p-p signal would be necessary to achieve approximately 1 b/s/Hz or about 250 kbps in the example of FIG. 5.

As illustrated above, when the transmit modem operates without regard to or independent of the PWM state, the system performance is limited by PWM harmonics falling in-band during every transition. The PWM harmonics may be handled in one embodiment by detecting them and erasing the received signal in the transition region. With 15% of the signal erased due to the PWM spikes, the transmit modem would need about 400 mV p-p signal injection.

One problem with the PWM system is that the modem transmitter coupling circuit impedance needs to be larger to ensure that the PWM signal is not distorted. With a large coupling circuit impedance, the actual signal level injected depends on the pilot wire or charging cable capacitance. Accordingly, to achieve a 400 mV signal injection, the transmit modem may need to provide a larger signal level. One possible solution to this situation is to use receiver feedback to set the transmit level for the modem. Another possible solution is to use a different coupling circuit with a large resistance ($R_{couple}$) in series with a large capacitance. The receive level would depend on $R2/R_{couple}$. Either the resistance or the transmit level may be adapted according to the receiver state.

Another problem with the PWM system is that other noise sources may affect performance, particularly when the EV charger is on, which will require a higher signal injection level. Possible solutions to this problem include not transmitting during PWM on state, injecting a larger signal level, or using a small coupling circuit impedance.

In view of the issues discussed above, it may not always be feasible for the modem to transmit. In another embodiment, the transmit modem only transmits during the PWM off state. In a first variation, the modem transmitter is not aware of the PWM state, but instead relies on the coupling circuit design for signal blocked. In a second variation, the modem transmitter is aware of the PWM state, and does not transmit during the PWM on state. With either of these variations, the transmit modem may inject enough signal during the PWM off state to enable communication. Accordingly, communication on a pilot wire is feasible with appropriate modem design.

Figure 6:
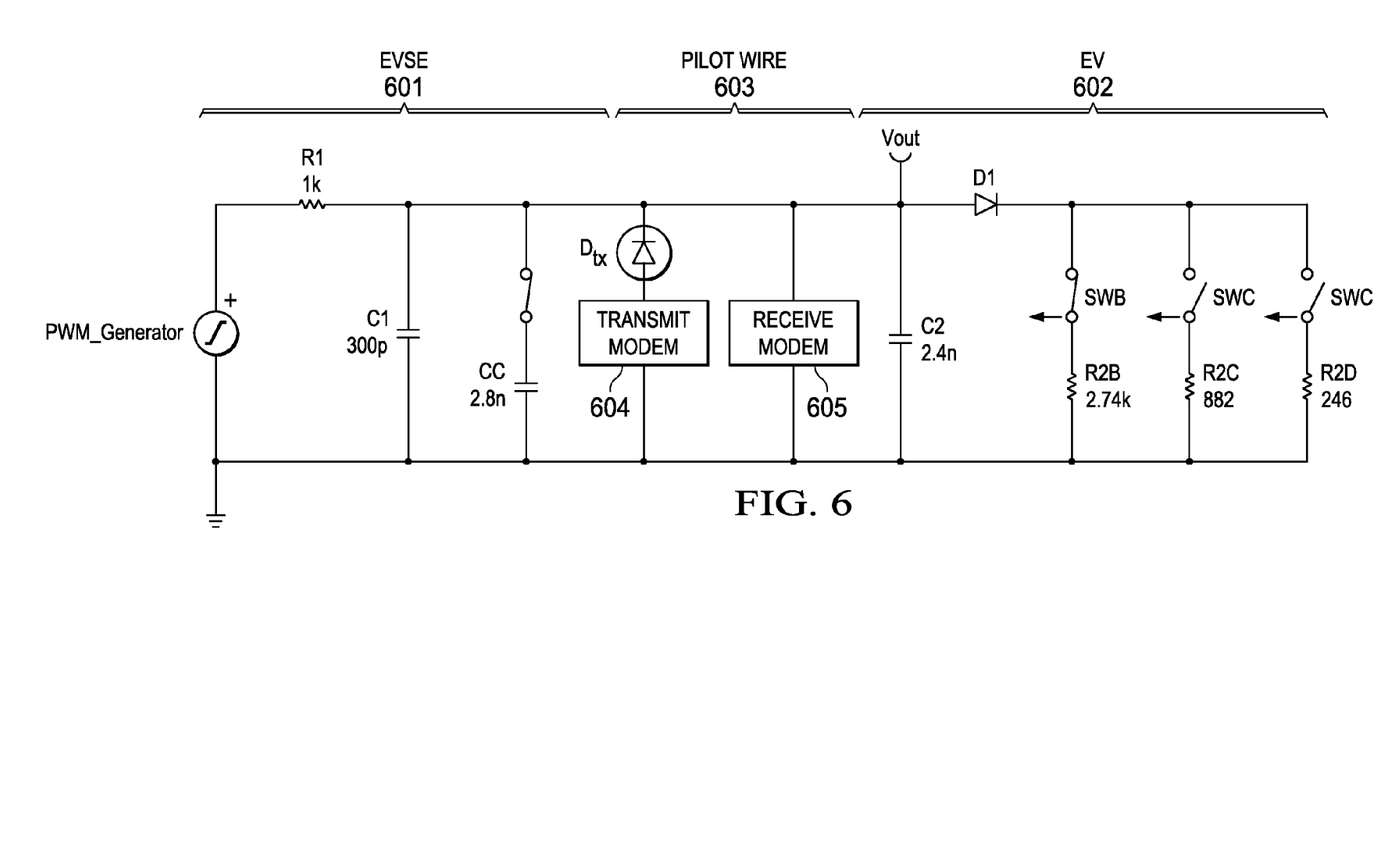
FIG. 6 illustrates a pilot-wire communication model having a transmit modem with a unidirectional coupling circuit.

FIG. 6 illustrates a pilot-wire communication model 600 having a transmit modem 604 with a unidirectional coupling circuit. Electric Vehicle Supply Equipment (EVSE) 601 communicates with Electric Vehicle (EV) 602 over pilot wire 603. Information is communicated between EVSE 601 and EV 602 using PWM signals on pilot wire 603. Transmit modem 604 and receive modem 605 also communicate over pilot wire 603 using, for example, OFDM or S-FSK signals.

Transmit modem 604 is coupled to pilot wire 603 via transmit diode $D_{tx}$. When the PWM signal is on, the top side of diode $D_{tx}$ is at a higher voltage than the bottom side and, therefore, diode $D_{tx}$ will not conduct. The PWM signal sees a high impedance when diode $D_{tx}$ is reversed biased. Therefore, the duty cycle of the PWM signal is level not affected by transmit modem 604. However, with diode $D_{tx}$ in a non-conductive state, the transmit signal from modem 604 is blocked. When the PWM signal is off, diode $D_{tx}$ will conduct the signal from transmit modem 604. Because the modem transmit signal is injected only when the PWM signal is off, the modem transmit signal may be 1-2 V p-p without distorting the PWM signal. Accordingly, a high data rate possible with this configuration.

Figure 7:
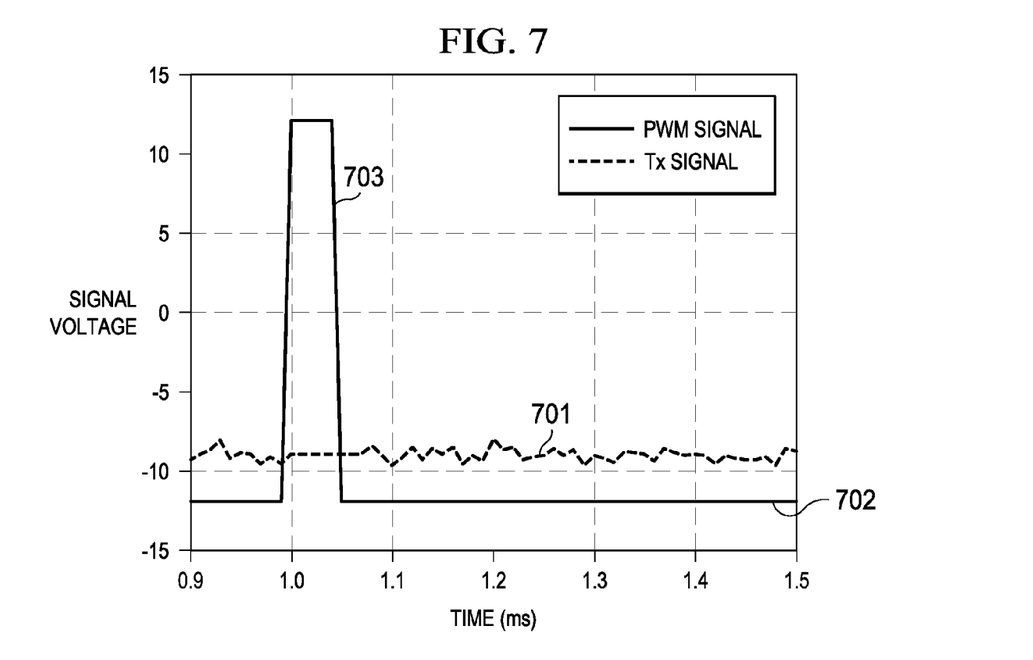
FIG. 7 illustrates a PWM-aware transmission in accordance one embodiment of the invention.

FIG. 7 illustrates a PWM-aware transmission 701 in accordance one embodiment of the invention. The transmit and receive modems synchronize to the PWM signal 702. The transmit modem detects the end of the PWM pulse 703 and starts transmitting while the PWM is off. The receive modem also detects the end of the PWM pulse 703 and begins processing the received signal. The synchronized receive modem may ignore the signals received during the PWM on-state.

In one embodiment, an OFDM symbol period of 1 ms is used. A zero prefix may be used instead of a cyclic prefix and may coincide with the PWM duty cycle. The transmission plan illustrated in FIG. 7 avoids interference from the PWM signal. White noise is the only source of error while the PWM signal is in the off-state. Additionally, the transmit modem may use a coupling circuit with small impedance during the PWM on-state.

As discussed above, there are two general methods that form communication on a pilot wire. In a first method, the modem transmits continuously without regard to the PWM state. In one embodiment, during the PWM on-state, the transmit modem uses a large transmit coupling circuit impedance, which results in a consequent variation in the signal level at the receive modem. To achieve reliable communications, the transmit modem may need a large signal injection level or receiver feedback for adaptation. With current noise assumptions, the transmit modem is estimated to require a transmit signal of approximately 400 mV p-p.

In a second method, the modem transmits only during PWM off-state. This may be accomplished in at least two ways, including coupling circuit blocking and transmitter synchronization. In one embodiment, synchronized transmission performs better than coupling circuit blocking, but may require more modem processing to identify the PWM on-state.

Many modifications and other embodiments of the invention will come to mind to one skilled in the art to which this invention pertains having the benefit of the teachings presented in the foregoing descriptions, and the associated drawings. Therefore, it is to be understood that the invention is not to be limited to the specific embodiments disclosed. Although specific terms are employed herein, they are used in a generic and descriptive sense only and not for purposes of limitation.

What is claimed is:

1. A circuit, comprising:
   a first modem coupled to a pilot wire system, the pilot wire system coupling electric vehicle service equipment and an electric vehicle and having a pilot wire carrying pulse width modulation (PWM) signals, the first modem transmitting communication signals to a second modem via the pilot wire; and
   an interface circuit coupling the first modem to the pilot wire, the interface circuit having an impedance that is larger than an effective impedance of the pilot wire system, which corresponds to a combination of an electric vehicle service equipment impedance, an electric vehicle impedance, and a pilot wire cable impedance.

2. The circuit of claim 1, wherein the communication signals are Orthogonal Frequency-Division Multiplexing (OFDM) signals.

3. The circuit of claim 2, wherein the OFDM signals comply with a PRIME (Powerline Related Intelligent Metering Evolution) or G3 standard.

4. A circuit, comprising:
   a first modem coupled to a pilot wire system, the pilot wire system coupling electric vehicle service equipment and an electric vehicle and having a pilot wire carrying pulse width modulation (PWM) signals, the first modem transmitting communication signals to a second modem via the pilot wire; and
   an interface circuit coupling the first modem to the pilot wire, the interface circuit having an impedance that is larger than an effective impedance of the pilot wire system; and
   a line driver circuit in the interface circuit, the line driver circuit amplifying the communication signals from the first modem prior to injection of the communication signals onto the pilot wire.

5. The circuit of claim 4, wherein the line driver circuit amplifies the communication signals by an amount proportional to a variation in the effective impedance of the pilot wire system.

6. The circuit of claim 5, wherein variations in the effective impedance of the pilot wire system are caused by the PWM signals changing from an on-state to an off-state.

7. The circuit of claim 4, wherein the communication signals are Orthogonal Frequency-Division Multiplexing (OFDM) signals.

8. The circuit of claim 7, wherein the OFDM signals comply with a PRIME (Powerline Related Intelligent Metering Evolution) or G3 standard.

9. A circuit, comprising:
   a first modem coupled to a pilot wire system, the pilot wire system coupling electric vehicle service equipment and an electric vehicle and having a pilot wire carrying pulse width modulation (PWM) signals, the first modem transmitting communication signals to a second modem via the pilot wire; and
   an interface circuit coupling the first modem to the pilot wire, the interface circuit comprising a diode that blocks the first modem communication signals from reaching the pilot wire when a PWM pulse is present on the pilot wire.

10. The circuit of claim 9, wherein the diode comprises an anode and a cathode, the anode coupled to the first modem, and the cathode coupled to the pilot wire.

11. The circuit of claim 10, wherein the diode conducts the communication signals from the first modem to the pilot wire when the PWM signals are off.

12. The circuit of claim 9, wherein the communication signals are Orthogonal Frequency-Division Multiplexing (OFDM) signals.

13. The circuit of claim 12, wherein the OFDM signals comply with a PRIME (Powerline Related Intelligent Metering Evolution) or G3 standard.

14. A method, comprising:
   coupling a first modem to a pilot wire system, the pilot wire system coupling electric vehicle service equipment and an electric vehicle and having a pilot wire carrying pulse width modulation (PWM) signals;
   monitoring the PWM signals to identify whether the PWM signals are on or off; transmitting communication signals from the first modem to a second modem via the pilot wire when the PWM signals are off; and
   stopping transmission of the communication signals when the PWM signals are on.

15. The method of claim 14, wherein the communication signals are Orthogonal Frequency-Division Multiplexing (OFDM) signals.

16. The method of claim 15, wherein the OFDM signals comprise a zero prefix that coincides with a duty cycle of the PWM signals.

17. The method of claim 15, wherein the OFDM signals comply with a PRIME (Powerline Related Intelligent Metering Evolution) or G3 standard.

* * * * *